United States Patent
Wagner

(10) Patent No.: US 12,216,180 B2
(45) Date of Patent: Feb. 4, 2025

(54) METHOD AND APPARATUS FOR DIAGNOSING AN EXHAUST GAS SENSOR

(71) Applicant: VITESCO TECHNOLOGIES GMBH, Hannover (DE)

(72) Inventor: Ekkehart-Peter Wagner, Munich (DE)

(73) Assignee: Vitesco Technologies GmbH, Hannover (DE)

(*) Notice: Subject to any disclaimer, the term of this patent is extended or adjusted under 35 U.S.C. 154(b) by 708 days.

(21) Appl. No.: 17/277,853

(22) PCT Filed: Sep. 6, 2019

(86) PCT No.: PCT/EP2019/073818
§ 371 (c)(1),
(2) Date: Mar. 19, 2021

(87) PCT Pub. No.: WO2020/058001
PCT Pub. Date: Mar. 26, 2020

(65) Prior Publication Data
US 2021/0348575 A1     Nov. 11, 2021

(30) Foreign Application Priority Data

Sep. 19, 2018   (DE) .......................... 102018215887.8

(51) Int. Cl.
*G01N 27/407*    (2006.01)
*F02D 41/20*     (2006.01)
(Continued)

(52) U.S. Cl.
CPC ............. *G01R 31/54* (2020.01); *F02D 41/20* (2013.01); *G01N 27/407* (2013.01);
(Continued)

(58) Field of Classification Search
CPC .. G01N 27/407; G01N 27/4175; G01R 31/54; G01R 31/52
(Continued)

(56) References Cited

U.S. PATENT DOCUMENTS 6,040,189 A * 3/2000 Buehler ............... G01N 27/126
                                                                    436/151
6,996,499 B2   2/2006 Kurokawa et al.
(Continued)

FOREIGN PATENT DOCUMENTS

CN    102016557 A    4/2011
CN    103291429 A    9/2013
(Continued)

OTHER PUBLICATIONS

Automotive Electronics Product Information CJ135—Lambda Probe Interface IC, Bosch Firmenschrift Dec. 9, 2010, http://www.bosch-semiconductors.com/media/ automotive_systems_ics/pdf_1/ic_engine_management/bosch_ic_cj135.pdf.
(Continued)

*Primary Examiner* — Alexander A Mercado
*Assistant Examiner* — Rodney T Frank
(74) *Attorney, Agent, or Firm* — Laurence A. Greenberg; Werner H. Stemer; Ralph E. Locher

(57) ABSTRACT

A method and a device for performing diagnostics on an exhaust gas sensor includes a series circuit of a Nernst cell and a first other cell. The exhaust gas sensor has a first, a second, and a third connection where a voltage drop can be measured between the first connection and the second connection by the Nernst cell and a voltage drop between the second connection and the third connection can be measured by the first other cell. The diagnostic method has steps for feeding a direct or alternating current into the first, second, and third connections; for directly or indirectly sensing an (Continued)

electrical voltage potential at at least one of the first, second, and third connections; and for evaluating the voltage potential sensed to diagnose a short circuit or an open circuit in the Nernst cell and/or in the first other cell.

20 Claims, 3 Drawing Sheets

(51) Int. Cl.
  *G01N 27/417* (2006.01)
  *G01R 31/52* (2020.01)
  *G01R 31/54* (2020.01)
(52) U.S. Cl.
  CPC ......... *G01N 27/4175* (2013.01); *G01R 31/52* (2020.01); *F02D 2041/2093* (2013.01)
(58) Field of Classification Search
  USPC ...................................... 73/114.71
  See application file for complete search history.

(56) References Cited

U.S. PATENT DOCUMENTS

| | | | |
|---|---|---|---|
| 9,062,623 | B2 | 6/2015 | Verdier et al. |
| 9,109,527 | B2 | 8/2015 | Barnikow et al. |
| 9,850,844 | B2 | 12/2017 | Bevot |
| 10,451,586 | B2 | 10/2019 | Higuchi et al. |
| 2004/0047396 | A1 | 3/2004 | Nomura et al. |
| 2005/0072205 | A1* | 4/2005 | Wagner .............. G01N 27/4065 73/23.32 |
| 2011/0133715 | A1 | 6/2011 | Zushi et al. |
| 2012/0266647 | A1* | 10/2012 | Barnikow ........... F02D 41/1477 73/1.06 |
| 2012/0266657 | A1* | 10/2012 | Barnikow ............ G01N 27/419 73/31.05 |
| 2012/0293183 | A1 | 11/2012 | Ledermann |
| 2013/0186169 | A1 | 7/2013 | Bevot et al. |
| 2013/0219984 | A1 | 8/2013 | Paggel et al. |
| 2016/0097737 | A1 | 4/2016 | Higuchi et al. |
| 2018/0024093 | A1 | 1/2018 | Watanabe et al. |

FOREIGN PATENT DOCUMENTS

| | | |
|---|---|---|
| DE | 10339684 A1 | 4/2004 |
| DE | 102008001697 A1 | 11/2009 |
| DE | 102009027378 A1 | 1/2011 |
| DE | 102009050221 A1 | 5/2011 |
| DE | 102009060172 A1 | 6/2011 |
| DE | 102010000663 A1 | 7/2011 |
| DE | 102010029776 A1 | 12/2011 |
| DE | 102011004073 A1 | 8/2012 |
| DE | 102011077171 A1 | 11/2012 |
| DE | 102013216223 A1 | 2/2015 |
| DE | 102014226922 A1 | 2/2016 |
| DE | 102015011931 A1 | 4/2016 |
| DE | 102014016952 A1 | 5/2016 |
| EP | 3064937 A1 | 9/2016 |
| EP | 3385732 A1 | 10/2018 |
| JP | 2011095199 A | 5/2011 |
| JP | 2011520112 A | 7/2011 |
| JP | 2017090129 A | 5/2017 |
| KR | 101735738 B1 | 5/2017 |
| WO | 2012110385 A1 | 8/2012 |

OTHER PUBLICATIONS

Automotive Electronics Product Information Lambda Probe Interface IC—CJ125, Bosch Firmenschrift, Apr. 26, 2006 http:/web.archive.org/web/20070221103504/http://www.semiconductors.bosch.d e/pdf/CJ125_Product_Info.pdf.
BOSCH, Automotive Electronics, Product Information Lambda Probe Interface IC-CJ125, Bosch Firmenschrift, Apr. 2006, http://web.archive.org/web/20070221103504/http://www.semiconductors.bosch.de/pdf/CJ125_Product_Info.pdf.
Ford Motor Company, 2018 My OBD system operation, summary for gasoline engines, Jun. 28, 2017, pp. 75-118, https://www.fordservicecontent.com/Ford_Content/catalog/motorcraft/OBDSM1802-2018.pdf, Dearborn, Michigan, USA, 2017.
IAV automotive engineering, Fehlersimulation für Lambdasonden, Aug 4, 2016. Berlin. 12 S.—http://web.archive.org/web/20160804075237if_/https://www.iav.com/sites/default/files/handouts/2015/de/iav-primero-produktbroschuere.pdf.
Continental, EGCP O2 sensor (lin,up) open circuit diagnosis, Engine management system : VW Simos 18.1 EA888, 2014, pp. 6112-6126, https://files.s4wiki.com/docs/Simos18%20Funktionsrahmen.pdf#page=6113, Hannover, Germany,.

* cited by examiner

METHOD AND APPARATUS FOR DIAGNOSING AN EXHAUST GAS SENSOR

BACKGROUND OF THE INVENTION

Field of the Invention

The present invention relates to a method and an apparatus for diagnosing an exhaust gas sensor.

Diagnosis of exhaust gas sensors by capturing voltage potentials at the pins (connections) of the exhaust gas sensor is very difficult on account of a highly temperature-dependent impedance, in particular of lambda probes, and is possible only in certain operating states. For example, pin-specific short-circuit diagnosis is possible only in a cold exhaust gas sensor, but pin-specific line break diagnosis is possible only in a warm exhaust gas sensor.

Short-circuit diagnosis is usually carried out nowadays by means of a simple voltage measurement. In this case, the very low impedance of the warm exhaust gas sensor of approximately 80Ω prevents a distinction between individual sensor pins since, on account of the current sensitivity of Lambda sensors, it is impossible to use measurement currents as soon as they exceed a few µA.

In contrast, line break diagnosis is rather impossible in cold exhaust gas sensors since the high impedances in cold exhaust gas sensors of more than 1 MΩ cannot be distinguished from a line break.

DE 10 2009 050 221 A1 discloses a method and an apparatus for diagnosing an exhaust gas sensor. The apparatus has three connections. Two different current sources simultaneously feed different alternating currents into two of the three connections. A diagnostic means determines electrical voltages at the connections in order to detect line interruptions and/or short circuits at the three connections.

SUMMARY OF THE INVENTION

The present invention is based on the object of providing a method and an apparatus for diagnosing an exhaust gas sensor, which can be used to diagnose line interruptions and/or short circuits in a more reliable manner and at low cost.

This object is achieved by the subject matter of the independent patent claims. Advantageous embodiments of the present invention are described in the dependent claims.

A first aspect of the invention relates to a diagnostic method for an exhaust gas sensor having a series circuit comprising a Nernst cell and a first further cell, wherein the exhaust gas sensor has a first connection, a second connection and a third connection such that a voltage drop across the Nernst cell can be measured between the first connection and the second connection and a voltage drop across the first further cell can be measured between the second connection and the third connection. The diagnostic method has steps for feeding a direct or alternating current into the first, second and third connections; for directly or indirectly capturing an electrical voltage potential at at least one of the first, second and third connections; and for evaluating the captured voltage potential in order to diagnose a short circuit or a line break in the Nernst cell and/or in the first further cell.

The term "cell" used here may comprise one or more components. These may be electrical or electrochemical components. A cell may be, for example, a single resistor or a galvanic cell. A cell has two connections (pins), at which an electrical voltage can be actively applied to the cell or at which an electrical voltage can be passively captured.

The present invention effectively implements pin-specific diagnosis by means of hardware resources which are present anyway. In this case, a pin voltage measurement which is present anyway and an AC-based impedance measurement method are used. According to the present invention, use is made of an algorithm for directly or indirectly capturing the electrical voltage potentials at the connections and for evaluating the captured voltage potentials in order to diagnose the short circuit or the line break in the Nernst cell and/or in the first further cell.

For example, low direct or alternating currents of the order of magnitude of 30 to 500 µA are applied to all connections of a heated or unheated exhaust gas sensor, for example a lambda probe, in succession. Sufficient voltage drops or potentials can still be achieved in this case even at a cell impedance of only 80Ω. With a cell impedance of 80Ω and a current intensity of 240 µA, 19 mV can be measured. The exhaust gas sensors are advantageously not damaged by such low current intensities.

The voltage is measured at the connections connected to the respective cell at the same time as the direct or alternating currents are fed in. The respective electrical voltage potential is preferably captured at a connection of a cell while the direct or alternating current is being fed only into one of the two connections. The respective electrical voltage potential is particularly preferably captured at a connection of a cell while the direct or alternating current is being fed only into a single connection of the exhaust gas sensor.

As a result, clear conclusions with regard to a short circuit or a line break can be drawn from the behavior of the respective cell. The measured voltage drops or potentials allow conclusions as to whether or not there is a short circuit or a line break in the respective cell.

The exhaust gas sensor preferably has a second further cell which is connected in series with the Nernst cell and the first further cell, wherein the exhaust gas sensor has a fourth connection such that a voltage drop across the second further cell can be measured between the fourth connection and one of the first to third connections. The diagnostic method also has steps for feeding a direct or alternating current into the fourth connection; for directly or indirectly capturing an electrical voltage potential at at least one of the first, second, third and fourth connections; and for evaluating the captured voltage potential in order to diagnose a short circuit or a line break in the Nernst cell, the first further cell and/or the second further cell.

The direct or alternating currents are preferably fed into the first to third connections and possibly into the fourth connection in a temporally staggered manner.

A voltage divider is preferably connected at least to one of the first, second, third and fourth connections and a voltage potential is captured in the voltage divider in order to indirectly capture the voltage potential at this connection. The voltage dividers make it possible to implement the voltages at the connections even at higher voltage levels, for example the battery voltage (12 V DC).

The voltage dividers are preferably passive voltage dividers.

The voltage potentials are preferably captured using an analog/digital converter and digital signals are captured from the analog/digital converter and evaluated.

The voltage potentials of the first to third connections and possibly the fourth connection are preferably supplied in succession to the analog/digital converter by means of multiplexing.

A short circuit is preferably captured at a connection of a cell if the alternating current is fed in at the connection and a DC voltage potential is captured at this connection. More preferably, the short circuit is captured at the connection of the cell only when the direct or alternating current is additionally fed in at another connection assigned to the cell and a DC or AC voltage potential is captured at this connection.

This is because no significant AC or DC voltage drop will occur at connections which are short-circuited with any voltage (battery voltage, ground or any other voltage). In contrast, connections which are associated with the short circuit only indirectly (that is to say via a heated sensor cell) will exhibit a voltage drop which is higher by 19 mV, for example.

A line break is preferably captured in a cell if the following two conditions are met: the direct or alternating current is fed in at a connection assigned to the cell and a substantially identical DC or AC voltage potential is then captured at this connection, and a lower DC voltage potential is captured at another connection assigned to the cell. More preferably, the line break is captured in the cell only when a DC or AC voltage potential is additionally captured at a connection of an adjacent cell. If there is a line break, AC voltages can be measured only at the connection feeding in AC. Adjacent connections do not exhibit an AC voltage and can therefore be easily identified.

The direct or alternating currents which are fed in each preferably have a current intensity of between 30 and 500 μA. The currents fed into the different connections may be substantially identical or may differ slightly, for example within a range of 10%.

A second aspect of the invention relates to an apparatus for diagnosing an exhaust gas sensor having a series circuit comprising a Nernst cell and a first further cell, wherein the exhaust gas sensor has a first connection, a second connection and a third connection such that a voltage drop across the Nernst cell can be measured between the first connection and the second connection and a voltage drop across the first further cell can be measured between the second connection and the third connection. The apparatus has means for feeding a direct or alternating current into the first, second and third connections; means for directly or indirectly capturing an electrical voltage potential at at least one of the first, second and third connections; and means for evaluating the captured voltage potential in order to diagnose a short circuit or a line break in the Nernst cell and/or in the first further cell.

The exhaust gas sensor preferably has a second further cell which is connected in series with the Nernst cell and the first further cell, wherein the exhaust gas sensor has a fourth connection such that a voltage drop across the second further cell can be measured between the fourth connection and one of the first to third connections. The apparatus also has means for feeding a direct or alternating current into the fourth connection; means for directly or indirectly capturing an electrical voltage potential at at least one of the first, second, third and fourth connections; and means for evaluating the captured voltage potential in order to diagnose a short circuit or a line break in the Nernst cell, the first further cell and/or the second further cell.

The apparatus also preferably has a first multiplexer which is configured to supply the voltage potentials of the first to third connections and possibly the fourth connection in succession to the analog/digital converter.

A voltage divider is preferably connected at least to one of the first, second, third and fourth connections and a voltage potential can be measured in the voltage divider in order to indirectly capture the voltage potential at this connection.

The means for capturing the voltage potentials preferably has an analog/digital converter and is configured to evaluate digital signals from the analog/digital converter.

The apparatus also preferably has a second multiplexer which is configured to feed the direct or alternating currents from a single current source in succession into the first to third connections and possibly into the fourth connection.

One of the first and second cells is preferably a pump cell or a trimming resistor. More preferably, the first further cell is a pump cell and the second further cell is a trimming resistor.

It should be noted that embodiments of the invention have been described with reference to different subjects of the invention. In particular, some embodiments of the invention are described by way of method claims and other embodiments of the invention are described by way of apparatus claims. However, it will become immediately clear to a person skilled in the art on reading this application that, unless explicitly stated otherwise, in addition to a combination of features which are associated with one type of subject matter of the invention, any combination of features which are associated with different types of subjects of the invention is also possible.

Further advantages and features of the present invention can be gathered from the following exemplary description of a preferred embodiment.

DETAILED DESCRIPTION OF THE INVENTION

It should be noted that the exemplary embodiments described below are merely a limited selection of possible variant embodiments of the invention.

Figure 1:
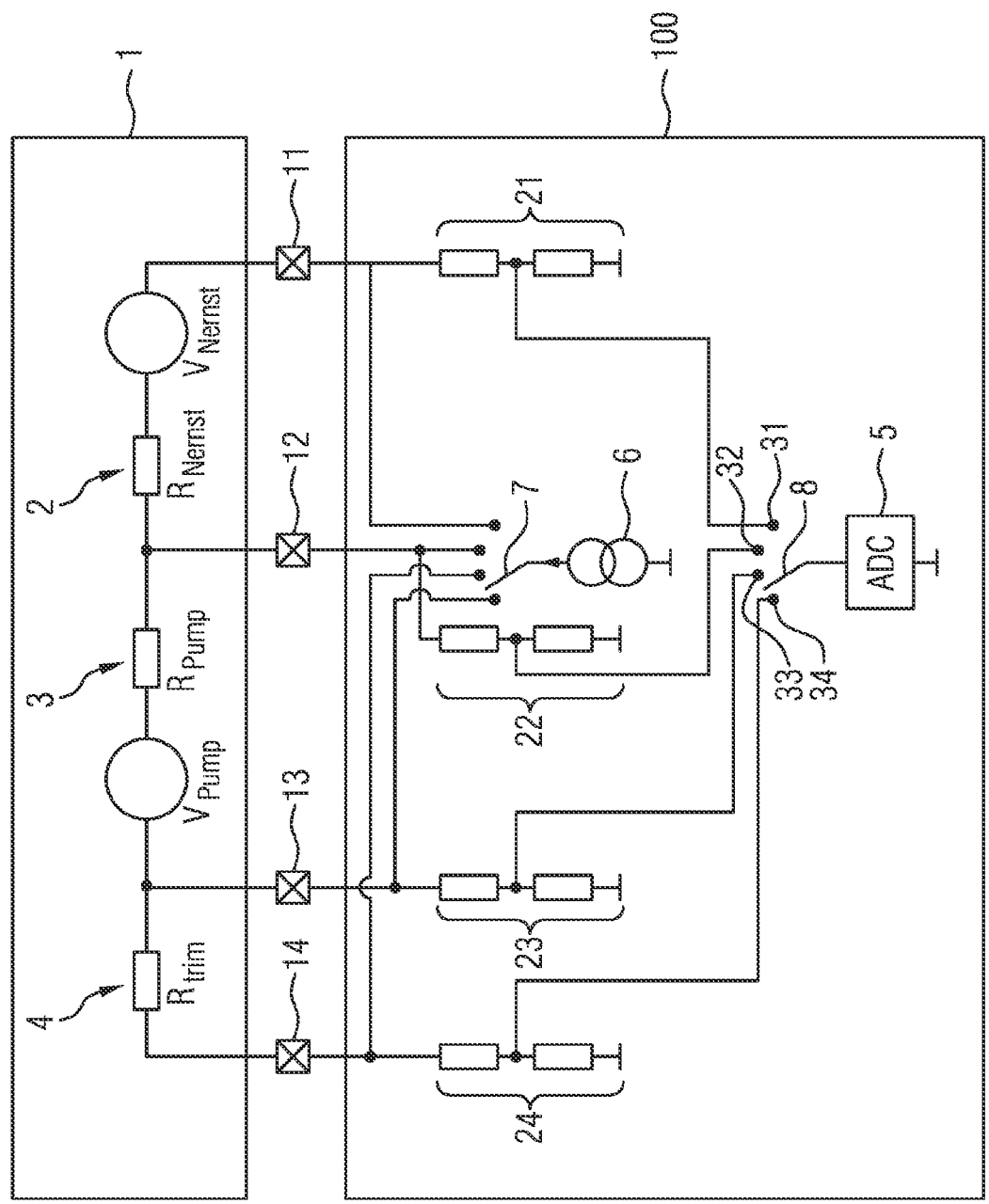
FIG. 1 shows an equivalent circuit diagram of an exhaust gas sensor and of an apparatus for diagnosing the exhaust gas sensor according to one exemplary embodiment of the present invention.

FIG. 1 shows an equivalent circuit diagram of an exhaust gas sensor 1 and of an apparatus 100 for diagnosing the exhaust gas sensor 1 according to one exemplary embodiment of the present invention. The exhaust gas sensor 1 is a broadband lambda probe which is referred to below as a lambda probe 1 for simplification. The lambda probe 1 measures a concentration of a gas component in the exhaust gas of an internal combustion engine.

In a known manner, the lambda probe 1 has a combination of a Nernst cell 2 and a first further cell in the form of a pump cell 3. In FIG. 1, the electrical equivalent circuit diagram of the Nernst cell 2 is formed by a series circuit comprising a resistor with a resistance value $RN_{ernst}$ and a voltage source with a Nernst voltage $V_{Nernst}$. In a corresponding manner, in FIG. 1, the electrical equivalent circuit diagram of the pump cell 3 is formed by a series circuit comprising a resistor with a resistance value $RP_{ump}$ and a voltage source with a pump voltage $V_{Pump}$.

The Nernst cell 2 and the pump cell 3 are in turn connected in series, wherein a Nernst cell voltage $V_n$ is dropped across the Nernst cell 2 and a pump cell voltage $V_p$ is dropped across the pump cell 3.

The Nernst cell 3 acts as a galvanic cell, at which an electrical voltage $V_{Nernst}$ is generated, which voltage changes on the basis of a concentration of a redox pair in the exhaust gas which passes through the Nernst cell 2.

An electrical voltage is applied to the pump cell 3. If the voltage exceeds a threshold value, a so-called limit current occurs and behaves in a manner proportional to the difference in the oxygen concentration on both sides of the Nernst cell 2. Oxygen atoms or oxygen ions are transported—in a polarity-dependent manner—with the current values. An amount of oxygen from the exhaust gas is supplied to the Nernst cell 2 from the pump cell 3 via a very narrow diffusion gap by means of electronic pump current control in such a manner that the state $\lambda=1$ prevails at the Nernst cell. Oxygen is pumped out if there is excess air in the exhaust gas (lean range). Oxygen is supplied by reversing the pump voltage if there is a low residual oxygen content in the exhaust gas (rich range). The respective pump current forms the output signal.

In other words, a pump voltage $V_{Pump}$ is applied to the pump cell 3 of the lambda probe 1, which pump voltage is set on the basis of a Nernst voltage $V_{Nernst}$, which corresponds to the oxygen concentration in the exhaust gas and is removed at the Nernst cell 2, with the aid of the pump current controller. The pump current controller is used to adjust the pump current in such a manner that the pump voltage $V_{Pump}$ is within predefinable limits.

The value of the pump current which is needed to set the state $\lambda=1$ is dependent on the oxygen concentration and therefore on the lambda value of the exhaust gas to be determined.

The Nernst cell 2 is connected between a first connection 11 and a second connection 12. The pump cell 3 is connected between the second connection 12 and a third connection 13. Accordingly, the node between the pump cell 3 and the Nernst cell 2 is connected to the second connection 12.

The lambda probe 1 has a trimming resistor 4 ($R_{trim}$) which is connected in series with the pump cell 3 in the exemplary embodiment illustrated. A fourth connection of the trimming resistor 4 ($R_{trim}$) which is not connected to the pump cell 3 is denoted using the reference sign 14. The trimming resistor 4 is used to compensate for production-related parameter variation of the lambda probe 1. The trimming resistor 4 may have a low resistance of the order of magnitude of approximately 40Ω. The trimming resistor 4 is referred to as a second further cell 4.

The drive circuit 100 comprises a direct or alternating current source 6 which is configured to generate a current with a current intensity of between 30 and 500 μA. The drive circuit 100 also has a multiplexer 7 which can be used to selectively introduce the generated direct or alternating current at the first to fourth connections 11 to 14. The drive circuit 100 also has four passive voltage dividers 21, 22, 23, 24 which are each accordingly assigned to one of the connections 11 to 14. A first voltage divider 21 is assigned to the first connection 11, a second voltage divider 22 is assigned to the second connection 12, a third voltage divider 23 is assigned to the third connection 13 and a fourth voltage divider 24 is assigned to the fourth connection 14. Within the respective voltage dividers 21, 22, 23, 24, an electrical voltage is respectively tapped off via a fifth to eighth connection 31 to 34. The fifth connection 31 is assigned to the first voltage divider 21, the sixth connection 32 is assigned to the second voltage divider 22, the seventh connection 33 is assigned to the third voltage divider 23 and the eighth connection 34 is assigned to the fourth voltage divider 24.

The fifth to eighth connections 31 to 34 are each connected, via a further multiplexer 8, to an analog/digital converter (ADC) 5 which selectively converts the respective analog voltages applied to the fifth to eighth connections 31, 32, 33, 34 into a digital signal.

For the procedure according to the invention, the current/voltage characteristics of the current source 6 and the voltages tapped off at the fifth to eighth connections 31, 32, 33, 34 are used.

In the method according to the invention, direct or alternating currents are fed into the first to third connections 11, 12, 13 and possibly into the fourth connection 14 in a temporally staggered manner. The direct or alternating currents fed into the different connections 11, 12, 13, 14 may be substantially identical or may differ slightly, for example within a range of 10%. The direct or alternating currents which are fed in each have a current intensity of between 30 and 500 μA.

A voltage potential is captured in the voltage dividers 21, 22, 23, 24 in order to indirectly capture the voltage potential at this connection 11, 12, 13, 14. The voltage potentials are also captured using the analog/digital converter 5, with the result that digital signals are captured from the analog/digital converter 5 and evaluated. In this case, the voltage potentials of the first to third connections and possibly the fourth connection 11, 12, 13, 14 are supplied in succession to the analog/digital converter 5 by means of multiplexing.

Figure 2:
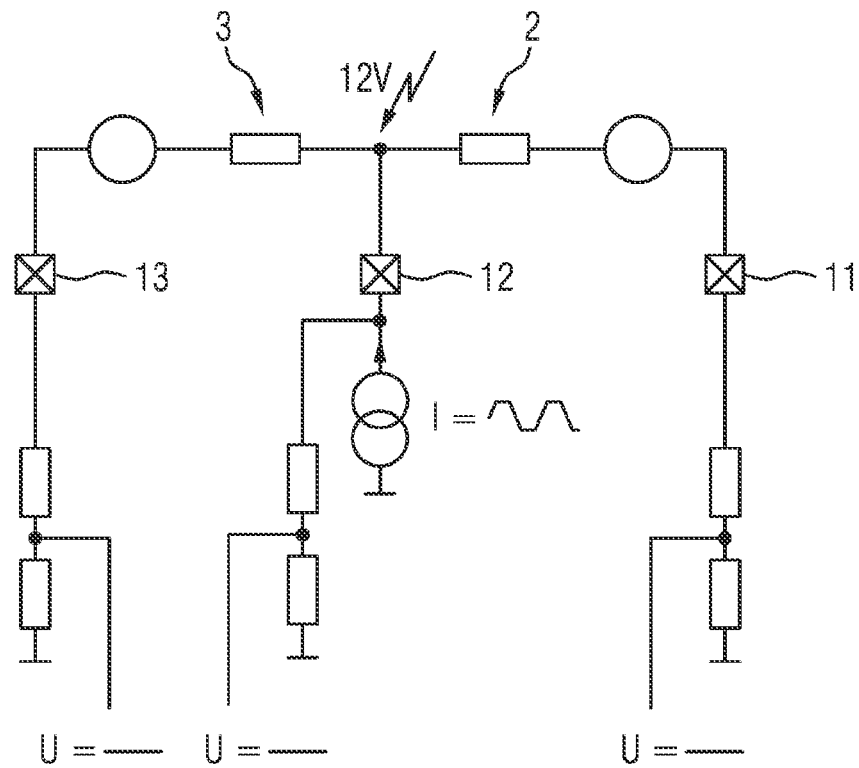
FIG. 2 shows diagnosis of a short circuit which is present between a Nernst cell and a pump cell of the exhaust gas sensor with respect to the battery voltage.
Figure 3:
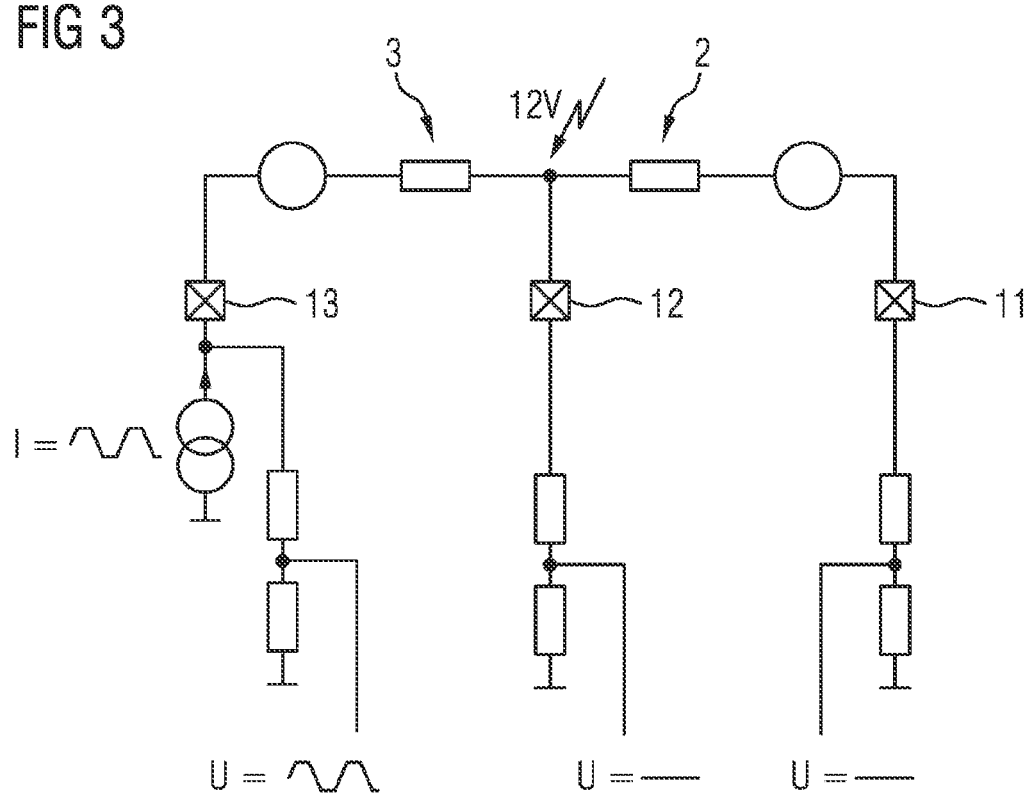
FIG. 3 shows diagnosis of the short circuit which is present between a Nernst cell and a pump cell of the exhaust gas sensor with respect to the battery voltage.

FIGS. 2 and 3 show diagnosis of a short circuit which is present between the Nernst cell 2 and the pump cell 3 of the exhaust gas sensor 1 with respect to the battery voltage.

The short circuit is captured at the connection 12 if the direct or alternating current is fed in at the connection 12 and a DC voltage potential is captured at this connection 12. The accuracy of the diagnosis can be increased if the short circuit is captured at the connection 12 only when the alternating current is additionally fed in at another connection 13 assigned to the pump cell 3 and an AC voltage potential or a lower DC voltage potential is captured at this connection 13.

Figure 4:
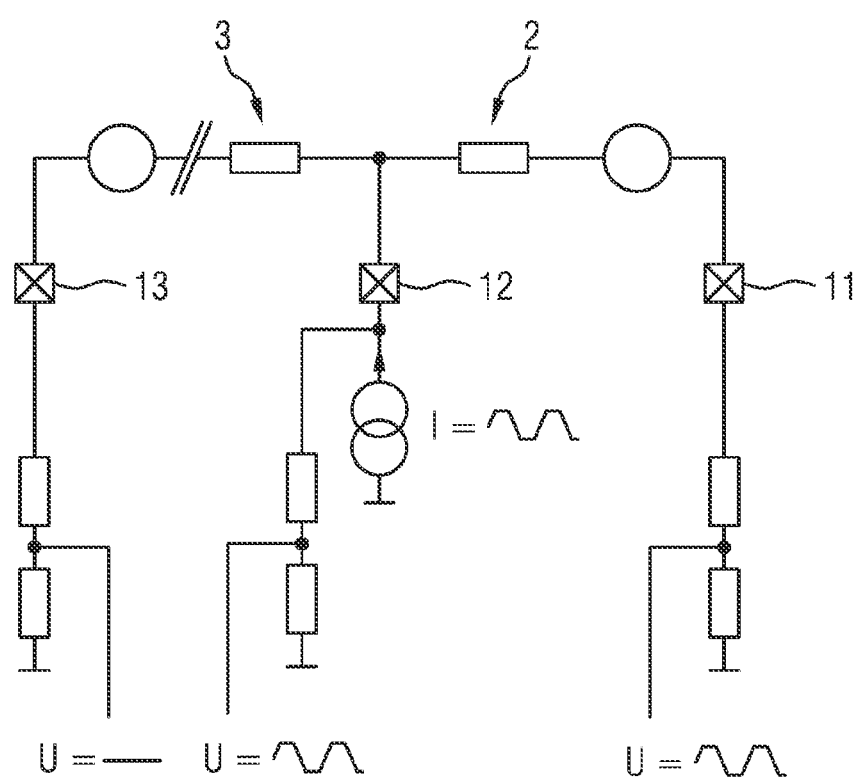
FIG. 4 shows diagnosis of a line break within the pump cell.

FIG. 4 shows diagnosis of a line break within the pump cell 3. The line break at the pump cell 3 is captured if the following two conditions are met: the alternating current is fed in at a connection 12 assigned to the pump cell 3 and a substantially identical AC voltage potential is captured at this connection 12, and a lower DC voltage potential is captured at another connection 13 assigned to the pump cell 3.

The accuracy of the diagnosis can be increased if the line break in the pump cell 3 is captured only when an AC voltage potential is additionally captured at the connection 11 of an adjacent cell, here the Nernst cell 2.

The respective electrical voltage potential is preferably captured at a connection of a cell 2, 3, 4 while the alternating current is being fed only into one of the two connections of this cell 2, 3, 4. The respective electrical voltage potential is particularly preferably captured at a connection of a cell 2, 3, 4 while the alternating current is being fed only into a single connection of the exhaust gas sensor 1. As a result, clear conclusions with respect to a short circuit or a line break can be drawn from the behavior of the respective cell 2, 3, 4.

The multiplexer selectively feeds a direct current or an alternating current from the single current source 6 directly into the first connection 11, the second connection 12, and the third connection 13.

The following modifications of the exemplary embodiments are possible:

In the exemplary embodiments illustrated, a linear lambda probe which is usually arranged upstream of a catalytic converter and is used to adjust the exhaust gas mixture is used. The present invention can also be applied to a so-called binary probe which does not have a pump cell.

Instead of using a multiplexer, different current sources can be alternatively used to feed the currents into the connections 11, 12, 13, 14.

The invention claimed is:

1. A diagnostic method for an exhaust gas sensor, the exhaust gas sensor having a series circuit of a Nernst cell and a further cell, and the exhaust gas sensor has a first connection, a second connection, and a third connection, and wherein a voltage drop across the Nernst cell is measurable between the first and second connections and a voltage drop across the further cell is measurable between the second and third connections, the diagnostic method comprising:
   selectively feeding, by a multiplexer, a direct current or an alternating current from a single current source directly into the first, second, and third connections;
   directly or indirectly capturing an electrical voltage potential at at least one of the first, second, or third connections; and
   evaluating the captured electric voltage potential for diagnosing a short circuit or a line break in at least one of the Nernst cell or the further cell.

2. The method according to claim 1, wherein the further cell is a first further cell and the exhaust gas sensor has a second further cell connected in series with the Nernst cell and the first further cell, and wherein the exhaust gas sensor has a fourth connection such that a voltage drop across the second further cell is measurable between the fourth connection and one of the first, second, or third connections, and wherein the diagnostic method further comprises:
   feeding a direct or alternating current into the fourth connection;
   directly or indirectly capturing an electrical voltage potential at at least one of the first, second, third, or fourth connections; and
   evaluating the captured electrical voltage potential in order to diagnose a short circuit or a line break in at least one of the Nernst cell, the first further cell, or the second further cell.

3. The method according to claim 2, which comprises feeding the direct current or alternating current into the first, second, third, and fourth connections in a temporally staggered manner.

4. The method according to claim 2, which comprises connecting a voltage divider to at least one of the first, second, third, or fourth connections and capturing a voltage potential in the voltage divider in order to indirectly capture the voltage potential at the respective connection.

5. The method according to claim 1, which comprises using an analog/digital converter in capturing the voltage potentials and converting captured signals to digital signals with the analog/digital converter and evaluating the digital signals.

6. The method according to claim 5, which comprises supplying the voltage potentials of the first, second, and third connections, in succession to the analog/digital converter by way of multiplexing.

7. The method according to claim 1, which comprises concluding that a short circuit exists at a given connection of a cell if the alternating current is fed in at the given connection and a DC voltage potential is captured at the given connection.

8. The method according to claim 7, which comprises capturing the short circuit at the given connection of the cell only when the direct or alternating current is additionally fed in at another connection assigned to the cell and an AC voltage potential or a lower DC voltage potential is captured at the given connection.

9. The method according to claim 1, which comprises concluding that a line break has been captured in a cell if the following two conditions are met:
   the direct or alternating current is fed in at a connection assigned to the cell and a substantially identical DC or AC voltage potential is then captured at the connection; and
   a lower DC voltage potential is captured at another connection assigned to the cell.

10. The method according to claim 9, wherein the line break is captured in the cell only when a DC or AC voltage potential is additionally captured at a connection of an adjacent cell.

11. The method according to claim 1, which comprises feeding in a direct current or an alternating current each having a current intensity of between 30 µA and 500 µA.

12. An apparatus for diagnosing an exhaust gas sensor having a series circuit with a Nernst cell and a further cell, the exhaust gas sensor having a first connection, a second connection, and a third connection, and a voltage drop across the Nernst cell is measurable between the first and second connections and a voltage drop across the further cell is measurable between the second and third connections, the apparatus comprising:
   a multiplexer configured for selectively feeding a direct current or an alternating current from a single current source directly into the first, second, and third connections;
   a device for directly or indirectly capturing an electrical voltage potential at at least one of the first, second, or third connections; and
   an evaluation device for evaluating the electrical voltage potential captured at one or more of the first, second, or third connections in order to diagnose a short circuit or a line break in one or both of the Nernst cell or the further cell.

13. The apparatus according to claim 12, further comprising a multiplexer configured to supply the voltage potentials of the first, second, and third connections in succession to said evaluation device.

14. The apparatus according to claim 12, wherein:
   the further cell is a first further cell and the exhaust gas sensor has a second further cell connected in series with the Nernst cell and the first further cell, the exhaust gas sensor has a fourth connection such that a voltage drop across the second further cell is measurable between the fourth connection and one of the first, second, and third connections;
   said current feed device is configured to feed a direct current or alternating current into the fourth connection;

said device is configured for directly or indirectly capturing the electrical voltage potential at at least one of the first, second, third, or fourth connections; and said evaluation device is configured for evaluating the captured voltage potential in order to diagnose a short circuit or a line break in at least one of the Nernst cell, the first further cell, or the second further cell.

15. The apparatus according to claim 14, further comprising a multiplexer configured to supply the voltage potentials of the first, second, third, and fourth connections in succession to said evaluation device.

16. The apparatus according to claim 14, further comprising a voltage divider connected to at least one of the first, second, third, and fourth connections, wherein a voltage potential is measurable in said voltage divider in order to indirectly capture the voltage potential at the respective said connection.

17. The apparatus according to claim 12, wherein said evaluation device comprises an analog/digital converter for capturing the voltage potentials and is configured to evaluate digital signals from said analog/digital converter.

18. The apparatus according to claim 15, wherein said multiplexer is configured to feed the direct current or alternating current from the single current source in succession into the first, second, and third connections.

19. The apparatus according to claim 14, wherein one of the first or second further cells is a pump cell or a trimming resistor.

20. The apparatus according to claim 14, wherein the first further cell is a pump cell and the second further cell is a trimming resistor.

* * * * *